United States Patent
Kleint et al.

(10) Patent No.: US 7,205,195 B2
(45) Date of Patent: Apr. 17, 2007

(54) METHOD FOR FABRICATING NROM MEMORY CELLS WITH TRENCH TRANSISTORS

(75) Inventors: Christoph Kleint, Dresden (DE); Christoph Ludwig, Langebruck (DE); Josef Willer, Riemerling (DE); Joachim Deppe, Dresden (DE)

(73) Assignees: Infineon Technologies AG, Munich (DE); Infineon Technologies Flash GmbH & Co. KG, Dresden (DE)

(*) Notice: Subject to any disclaimer, the term of this patent is extended or adjusted under 35 U.S.C. 154(b) by 0 days.

(21) Appl. No.: 11/006,049

(22) Filed: Dec. 7, 2004

(65) Prior Publication Data

US 2005/0085037 A1   Apr. 21, 2005

Related U.S. Application Data

(63) Continuation of application No. PCT/DE03/01573, filed on May 15, 2003.

(30) Foreign Application Priority Data

Jun. 7, 2002   (DE) ................. 102 25 410

(51) Int. Cl.
  *H01L 21/336* (2006.01)
(52) U.S. Cl. ............ 438/259; 438/589; 257/330; 257/E21.428; 257/E29.321
(58) Field of Classification Search ............ 438/259, 438/267, 270, 589, 595, 724; 257/330
See application file for complete search history.

(56) References Cited

U.S. PATENT DOCUMENTS

| | | | |
|---|---|---|---|
| 5,321,289 A | 6/1994 | Baba et al. | |
| 5,392,237 A | 2/1995 | Iida | |
| 5,519,236 A | 5/1996 | Ozaki | |
| 5,576,567 A | 11/1996 | Mori | |
| 6,326,272 B1 * | 12/2001 | Chan et al. | 438/300 |
| 6,548,861 B2 * | 4/2003 | Palm et al. | 257/330 |
| 6,794,249 B2 | 9/2004 | Palm et al. | |
| 2002/0024092 A1 | 2/2002 | Palm et al. | |
| 2003/0006428 A1 | 1/2003 | Palm et al. | |
| 2003/0015752 A1 | 1/2003 | Palm et al. | |

FOREIGN PATENT DOCUMENTS

| | | |
|---|---|---|
| DE | 100 39 441 A1 | 2/2002 |
| DE | 101 29 958 A1 | 1/2003 |
| EP | 0 594 177 A1 | 4/1994 |
| WO | WO 02/15276 A2 | 2/2002 |
| WO | WO 03/001600 A2 | 1/2003 |

\* cited by examiner

OTHER PUBLICATIONS

Eitan, B, et al., "NROM: A Novel Localized Trapping, 2-Bit Nonvolatile Memory Cell," IEEE Electron Device Letters, vol. 21, No. 11, Nov. 2000, pp. 543-545.

*Primary Examiner*—Quoc Hoang
(74) *Attorney, Agent, or Firm*—Slater & Matsil, L.L.P.

(57) ABSTRACT

An electrically conductive bit line layer is applied and patterned into portions arranged parallel to one another before the trench is etched into the semiconductor material, in which case, after the patterning of the bit line layer (3, 4) and before the etching of the trench, an implantation is introduced for the purpose of defining the position of the junctions, or, after the implantation of the $n^+$-type well (19) for the source/drain regions, the bit line layer (3, 4) is patterned using an etching stop layer (2) arranged on the semiconductor body (1).

23 Claims, 4 Drawing Sheets

METHOD FOR FABRICATING NROM MEMORY CELLS WITH TRENCH TRANSISTORS

This application is a continuation of co-pending International Application No. PCT/DE03/01573, filed May 15, 2003, which designated the United States and was not published in English, and which is based on German Application No. 102 25 410.9, filed Jun. 7, 2002, both of which applications are incorporated herein by reference.

TECHNICAL FIELD

The present invention relates to a fabrication method for NROMs with trench transistors and separate bit lines.

BACKGROUND

Extremely small nonvolatile memory cells are required for very large scale integration density in multimedia applications. The further development of semiconductor technology is enabling increasingly larger storage capacities which, however, are not achieved in the context of conventional fabrication technologies.

DE 100 39 441 A1, which is a counterpart application to U.S. Patent Application No. 2002/024092, describes a memory cell having a trench transistor arranged in a trench formed at a top side of a semiconductor body. An oxide-nitride-oxide layer sequence (ONO layer) is in each case present as storage layer between the gate electrode introduced into the trench and the laterally adjoining source region and the drain region adjoining the latter on the other side. This layer sequence is provided for trapping charge carriers (hot electrons) at source and drain.

DE 101 29 958, which is a counterpart application to U.S. Pat. No. 6,548,861, describes a memory cell arrangement in which a further reduction of the dimensions of the memory cells is achieved in conjunction with an access time kept sufficiently short for writing and reading by virtue of the fact that the bit lines are formed with sufficiently low impedance. For this purpose, separate layers or layer sequences patterned in strip form in accordance with the bit lines are arranged as bit lines on the doped source/drain regions of the individual memory transistors. These layer sequences may comprise doped polysilicon or a metallic layer. In particular, the metallic layer may be a siliconized metal layer which is fabricated by the method known by the designation "salicide" as an abbreviation of self-aligned silicide.

NROM memory cells are described in the publication by B. Eitan et al.,: "NROM: A Novel Localized Trapping, 2-Bit Nonvolatile Memory Cell" in IEEE Electron Device Letters 21, 543 (2000). Owing to the particular material properties, source/drain voltages of 4 to 5 volts are typically necessary during programming and erasing for memory cells of this type. Therefore, the channel lengths of the memory transistor cannot be fabricated significantly below 200 nm. It would be desirable, however, if, despite this channel length of 200 nm, the width of the bit lines could be reduced in such a way as to enable a cell area of less than 5 $F^2$. Also desirable are bit lines with sufficiently low electrical resistance, so that multiple connection of the bit lines at intervals within the memory cell array (bit line strapping) could be dispensed with, no contact holes for the electrical connection of the bit lines would have to be fabricated between the word lines and the area required between the bit lines could thereby be reduced.

SUMMARY OF THE INVENTION

In one aspect, the present invention specifies how, in the fabrication of NROM memory cells, the above-mentioned requirements can be fulfilled and the fabrication variations are at the same time reduced to a minimum.

This aspect is achieved by means of the method of providing a semiconductor body that is doped to a first conductivity type, the upper portion being doped to a second conductivity type. Conductive lines are formed over the semiconductor body and a recess is etched between the conductive lines and extend through the upper portion of the semiconductor body. A storage layer, with a conductor formed on top, is formed within the recess. Refinements are disclosed herein.

In the method, the memory transistor is formed in a trench at a top side of a semiconductor body or a semiconductor layer. The gate electrode is introduced into the trench and is isolated from the laterally adjoining source/drain regions by a storage layer, in particular an ONO layer. Electrically conductive layers, preferably comprising a plurality of layer elements, are arranged above the source/drain regions parallel to the trenches. It is important to be able to define the trench depth relative to the depth of the source/drain regions, so that the position at which the lower boundary area of the source/drain regions adjoins the trench, the so-called junction, can be set precisely. As a result, the channel length lying between the junctions on both sides is set very precisely in accordance with the predetermined value.

In the method, that is achieved by virtue of the fact that an implantation is introduced for the purpose of defining the position of the junctions after the patterning of the bit line layer and before the etching of the trench or the bit line layer is patterned after an implantation of the source/drain regions using an etching stop layer arranged on the semiconductor material. What is thus achieved is that, after the patterning of the low-impedance bit lines, the distance between the top side of the semiconductor material into which the trench is etched and the depth—measured proceeding from this—of the position of the junctions always has precisely the predetermined value.

If no separate etching stop layer is used, the critical position of the top side of the semiconductor material results during the etching of the bit lines. In this case, the depth of the position of the junctions is subsequently set by means of a separately introduced implantation of dopant, which finally forms the source/drain regions. If the implants for the source/drain regions have already been introduced before the fabrication of the bit lines, what is achieved by an etching stop layer is that the original top side of the semiconductor material remains intact during the patterning of the bit lines, so that the distance between the top side and the junctions maintains the original value in this case, too. With the use of an etching stop layer which is initially applied over the whole area, it is possible to produce a good electrical junction between the bit lines and the source and drain regions by the etching stop layer being partly removed on both sides below the bit lines and the resulting interspaces being filled with an electrically conductive contact layer, e.g., made of conductively doped polysilicon.

BRIEF DESCRIPTION OF THE DRAWINGS

Examples of the method are described in more detail below with reference to the accompanying figures, which each show cross sections through intermediate products after different steps of the fabrication method.

The following list of reference symbols can be used in conjunction with the figures:

| | |
|---|---|
| 1 | Semiconductor body |
| 2 | Etching stop layer |
| 3 | First bit line layer |
| 4 | Second bit line layer |
| 5 | Hard mask layer |
| 6 | Oxide layer |
| 7 | Spacer |
| 8 | Trench |
| 9 | Storage layer |
| 10 | First word line layer |
| 11 | Second word line layer |
| 12 | Further hard mask layer |
| 13 | Contact layer |
| 14 | Remaining portion of the contact layer |
| 15 | Source/drain region |
| 16 | Junction |
| 17 | Channel region |
| 18 | Gate electrode |
| 19 | n$^+$-type well |
| 20 | Further well implant |
| 21 | Resist mask |

DETAILED DESCRIPTION OF ILLUSTRATIVE EMBODIMENTS

Figure 1A:
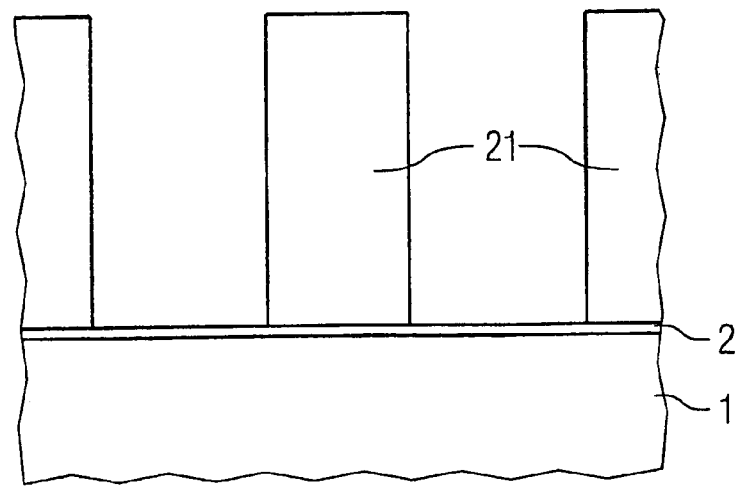
FIGS. 1A to 1E show cross-sections through intermediate products after different steps of a preferred first exemplary embodiment of the method.

A preferred exemplary embodiment of the method begins, in accordance with the cross-section illustrated in FIG. 1A, proceeding from a semiconductor body 1 or a semiconductor layer 1 applied on a substrate, on which firstly a pad oxide/nitride 2 is applied in a manner known per se. The semiconductor body 1 preferably has a basic doping which is weakly p-conducting. At the top side provided with the pad oxide 2, an n$^+$-doped well is formed by introduction of dopant. The pad oxide layer later serves as an etching stop layer 2. An oxide is preferred here, although in principle any material with respect to which the material of the bit line layers to be applied can be etched selectively is suitable as an etching stop layer 2.

Preferably, all STI isolations (shallow trench isolation) are fabricated at this point in the method. The STI isolations (not shown) may surround the entire memory cell array or individual blocks of the memory cell array. It is possible, in addition, to provide those isolation trenches between the individual memory cells which, with respect to the cross-section illustrated in FIG. 1A, run at regular intervals in front of and behind the plane of the drawing and parallel to the plane of the drawing. Well implants for forming CMOS transistors of the driving periphery may likewise be introduced at this stage of the method. These method steps are performed in a manner known per se as in the case of the fabrication of customary memory cell arrays. A resist mask 21 having openings in the regions of the bit lines to be fabricated is then applied. Using this resist mask 21, the etching stop layer 2, here the pad oxide, is removed in regions.

Figure 1B:
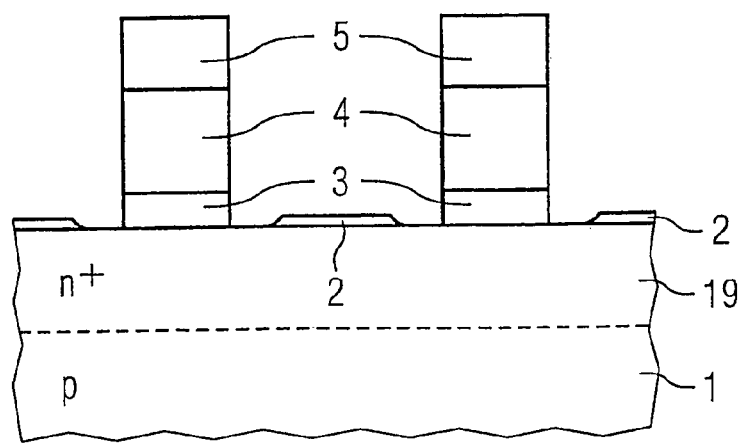

At least one electrically conductive bit line layer is then applied to the top side in accordance with FIG. 1B. A layer stack comprising firstly a first bit line layer 3 preferably made of polysilicon, a second bit line layer 4 made of a metal or metal silicide and a hard mask layer 5 is preferably applied here. In order to facilitate the subsequent lithography steps, preferably, a thin antireflection layer, not depicted in the figure, is additionally applied to the top side in a manner known per se. Afterward, firstly the hard mask layer 5 is patterned by means of a photolithography, so that the second bit line layer 4 and the first bit line layer 3 can then be etched back using the hard mask thus fabricated.

Since the remaining portions of the etching stop layer 2 are still present in the regions between the bit line webs to be fabricated, a clear signal that the etching end point has been reached is produced when the etching stop layer 2 is reached. As required, the etching of the first bit line layer 3, which is preferably polysilicon here, may additionally be continued somewhat further in order to ensure that all remaining portions of the polysilicon have been removed. The structure illustrated in FIG. 1B is obtained in this way, which structure also depicts the first n$^+$-type implant for forming the n$^+$-type well 19 in the p-conducting semiconducting body 1, identified by the broken line.

Figure 1C:
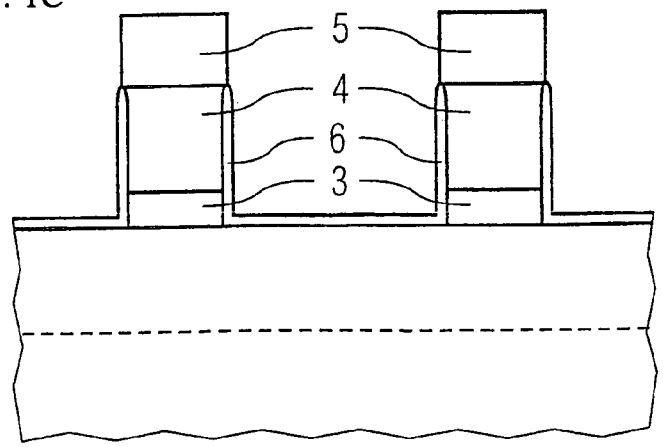

In the exemplary embodiment described here, it is expedient next to cover the bit line webs laterally with a thin oxide layer 6. This is illustrated in cross-section in FIG. 1C, in which it is assumed that the first bit line layer 3 is polysilicon and the second bit line layer 4 is a metallic layer, in particular a metal silicide. These layers are therefore oxidized superficially, so that the thin oxide layer 6 covers the semiconductor material and the sidewalls of the bit line webs. In this case, the hard mask layer 5, which is, e.g., a nitride, is not oxidized or is only slightly oxidized.

In accordance with the cross-section of FIG. 1D, spacers 7 are then fabricated at the sidewalls of the bit line webs, preferably by firstly a nitride layer being deposited with uniform thickness over the whole area and this layer subsequently being etched back in an anisotropic step to an extent such that the spacers 7 depicted in FIG. 1D remain. In this case, the thin oxide layer 6 again serves as an etching stop layer, so that the top side of the semiconductor body 1 is not attacked. Trenches 8 provided for the memory transistors are then etched out in each case between the spacers 7 fabricated. This is done by means of a so-called breakthrough step, in which, as is customary, in a plurality of successive etching steps, firstly the thin oxide layer 6 is removed and then the semiconductor material is etched out in trench form.

Figure 1D:
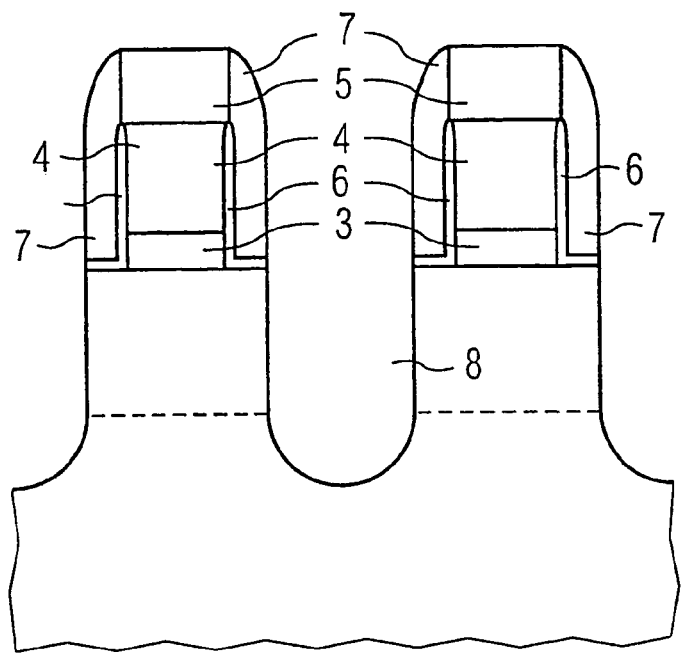

The trench 8 depicted in FIG. 1D is thus formed. Owing to the previously present etching stop layer 2 or the oxide layer 6, before the trench etching, the top side of the semiconductor body 1 was at a precisely defined distance from the lower interface of the source/drain regions, as is depicted by a broken line in FIG. 1D. Situated at the locations where the interface adjoins the trench walls are the so-called junctions which define the start and the end of the channel region arranged in between. The channel region is situated at the top side of the semiconductor material between the junctions in the region of the trench bottom. After the etching of the trench 8, the walls and the bottom of the trench can be improved by application of a sacrificial layer made of a thin oxide, which is subsequently removed. The storage layer provided may then subsequently be applied to the thus improved surface of the semiconductor material.

Figure 1E:
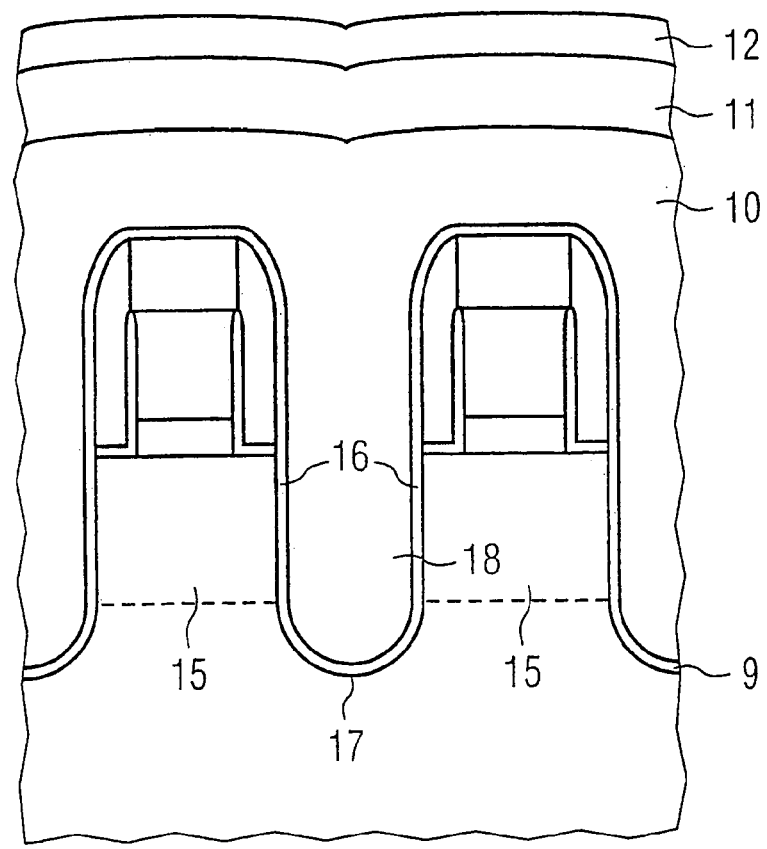

The illustration in FIG. 1E shows in cross-section that the storage layer 9 is applied over the whole area of the structure illustrated in FIG. 1D. The storage layer 9 is preferably an oxide-nitride-oxide layer sequence in which the nitride layer is provided as storage medium and the two oxide layers are provided as boundary layers for trapping charge carriers. In the region of the driving periphery, the storage layer 9 can be removed photolithographically and be replaced by suitable dielectric layers as gate oxide of the driving transistors.

In order to fabricate the gate electrodes of the memory transistors, a first word line layer 10 made of doped polysilicon is then preferably applied. That portion of this first word line layer 10 which fills the respective trench forms a relevant gate electrode 18. As already mentioned above, STI isolation trenches may have been introduced into the semiconductor material parallel to the word lines. The trenches are therefore interrupted in the longitudinal direction in each case by the insulating material, in particular silicon dioxide, so that, in this last-specified method step, the material of the first word line layer 10 is introduced into the trenches 8 of the memory transistors only between the STI isolation trenches. The gate electrodes 18 thus fabricated are isolated from the source/drain regions 15 by the storage layer 9. Between the junctions 16, the channel region 17 is situated directly below the storage layer 9 in the semiconductor material. A second word line layer 11, applied to the top side of the first word line layer 10, is preferably a metal silicide, in particular tungsten silicide (WSi). A further hard mask layer 12 applied thereto serves for patterning the word lines as strips which run from left to right within the plane of the drawing in FIG. 1E. Further method steps that are additionally required in order to complete the memory cell arrangement are effected in the manner known per se from the prior art.

Figure 2A:
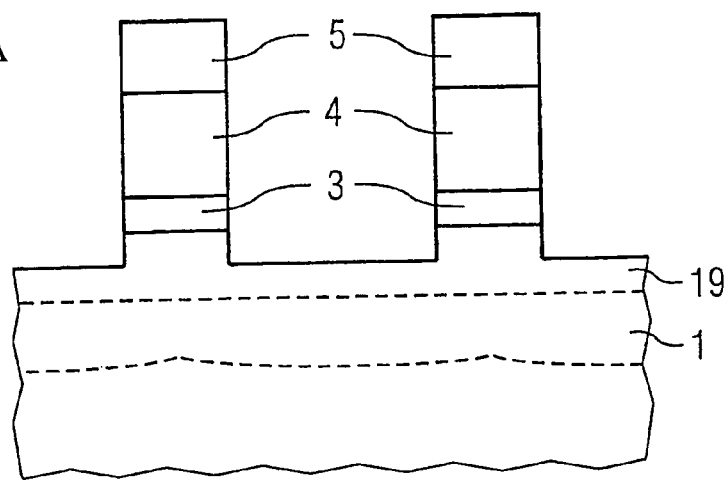
FIGS. 2A to 2C show cross-sections corresponding to FIGS. 1B to 1D for a further exemplary embodiment of the method.

In an alternative exemplary embodiment of the method, no etching stop layer is used or the initially applied pad oxide is completely removed before the bit line layers are applied. A cross-section corresponding to the method step of FIG. 1B is illustrated in FIG. 2A. Here the illustration shows the $n^+$-type well 19 for forming the source/drain regions in the semiconductor body 1. As can be discerned, during the patterning of the bit line strips, which here likewise comprise a first bit line layer 3 (preferably conductively doped polysilicon), a second bit line layer 4 (preferably tungsten silicide) and a hard mask layer 5, etching is effected right into the semiconductor material. Therefore, the top side of the semiconductor body 1 is correspondingly lowered between the bit line strips, so that the distance between the lower interface of the $n^+$-type well and the top side of the semiconductor body 1 is reduced here. In order to reliably isolate the bit line strips from one another, the etching process is continued here until all material of the first bit line layer 3 has been removed.

In order to attain a precisely defined distance between the junctions and the top side of the semiconductor material in this exemplary embodiment, too, so that the channel length can be set exactly during the trench etching, here the $n^+$-type well 19 is firstly formed only with a small depth, which suffices, however, to achieve a good electrical junction between the bit line strips and the semiconductor material situated underneath. Only after the etching of the bit line webs is the actual $n^+$-type doping effected, by means of which the source and drain regions are fabricated and the positions of the junctions are defined.

Figure 2B:
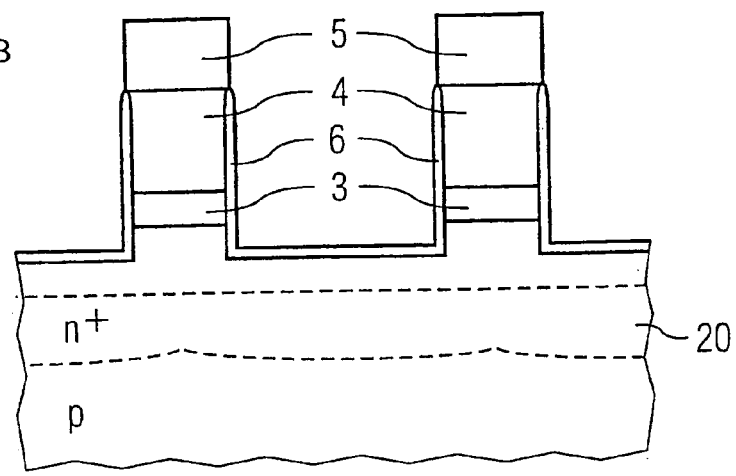

The further source/drain implantation is illustrated in cross-section in FIG. 2B with the doped $n^+$-type region 20.

The somewhat shallower profile of the dopant concentration below the bit line webs is indicated by the curved lower broken line. It can be discerned from this that the further well implant 20 was only introduced after the fabrication of the bit line webs. The implantation dose here is set such that the lower interface of the further well implant 20 is at an envisaged distance from the top side of the semiconductor material between the bit line webs. The fabrication of a thin oxide layer 6, which covers the sidewalls of the bit line webs, then follows in the manner described above.

Figure 2C:
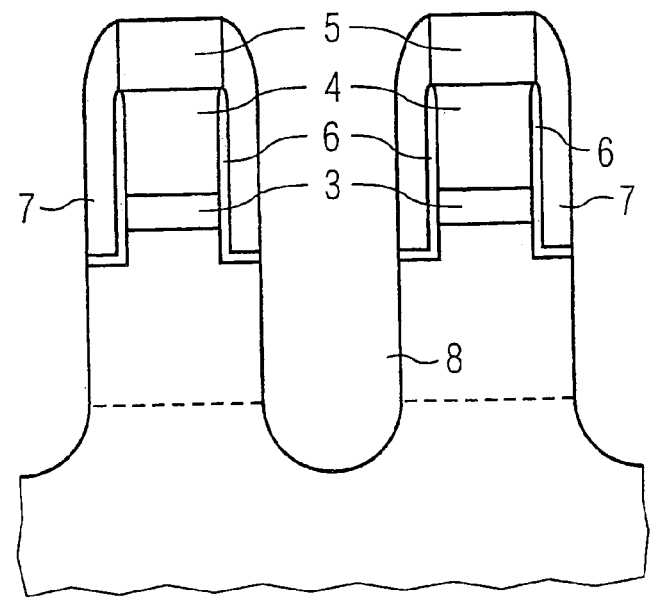

The cross-section illustrated in FIG. 2C corresponds to the cross-section of FIG. 1D after the fabrication of the spacers 7 and the etching of the trench 8. The position of the junctions, which is defined by the position of the lower interface of the further well implant at the walls of the trench 8, is situated at the envisaged distance from the top side of the semiconductor body in the region between the bit line webs, so that here, too, during the etching of the trench 8, the etching depth can be set so precisely that the envisaged channel length is fabricated.

Figure 3A:
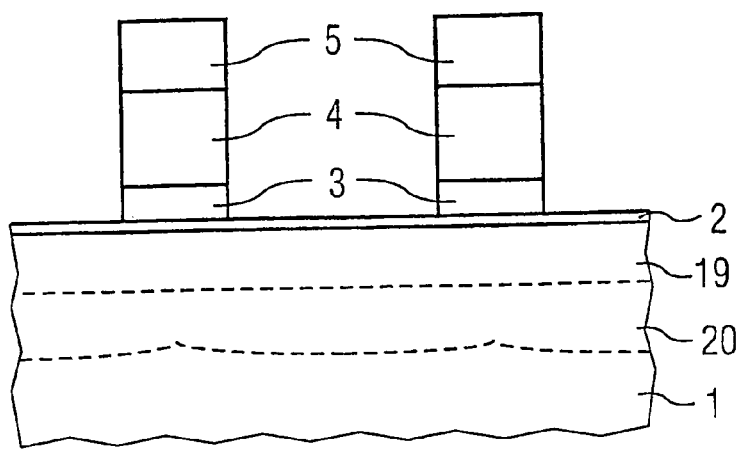
FIGS. 3A to 3C show cross-sections corresponding to FIGS. 1B to 1D for a further exemplary embodiment of the method.

A further exemplary embodiment of the method is based on a whole-area etching stop layer 2. The bit line layers are applied on the etching stop layer 2, e.g., the pad oxide layer. The cross-section, illustrated in FIG. 3A, shows the arrangement after the etching of the bit line webs. Here the illustration shows that even with the use of an etching stop layer 2, the implantation of the dopant provided for the source and drain regions can be effected in two steps before the application of the bit line layers and after the application of the bit line layers. Therefore, an $n^+$-type well 19 and a further well implant 20 are depicted here, too. Since the etching stop layer 2 is present over the whole area, firstly there is only an inadequate electrical contact between the $n^+$-type well 19 and the first bit line layer 3 (preferably conductively doped polysilicon). The etching stop layer 2 is therefore removed, so that only a small portion of the etching stop layer 2 remains below the bit line webs.

Figure 3B:
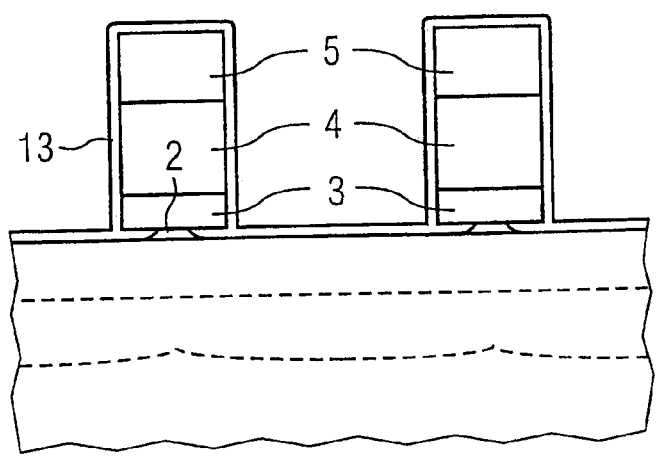

FIG. 3B depicts the remaining portions of the etching stop layer 2 below the bit line webs in cross-section. A contact layer 13, which is preferably a thin electrically conductive polysilicon layer, is applied over the whole area. This contact layer 13 fills the interspaces on both sides between the bit line strip and the semiconductor body 1. This results in a good electrical junction between the bit line webs and the semiconductor material of the $n^+$-type well 19. The remaining portions of the contact layer 13 on and between the bit line webs are removed.

Figure 3C:
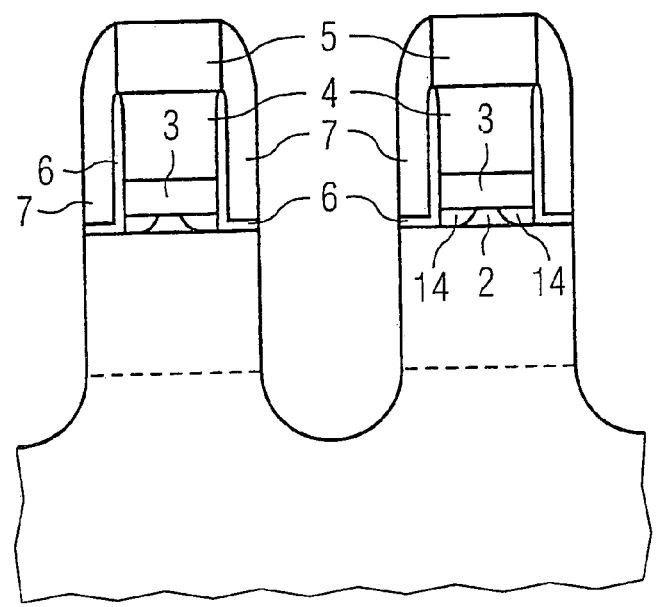

FIG. 3C illustrates the structure achieved with this exemplary embodiment of the method in accordance with the method step of FIG. 1D in cross-section. Here a remaining portion of the etching stop layer 2 and also the remaining portions 14 of the contact layer 13 are situated below the bit line webs. For the rest, the structure illustrated corresponds to the structure in accordance with FIG. 1D, identical reference symbols designating identical parts.

With the various exemplary embodiments of the method, it is possible a) to provide oxide isolations between adjacent channels in the form of STI isolations;

b) to set a channel length of about 200 nm to a predetermined value very exactly;

c) to form a virtual-ground NOR memory architecture with metalized bit lines for reducing the bit line resistance, and d) to keep fabrication variations extremely small.

With this method, therefore, it is possible to further reduce the area requirement of an NROM memory.

What is claimed is:

1. A method of forming a semiconductor device, the method comprising:
   providing a semiconductor body that is doped to a first conductivity type;
   doping an upper portion of the semiconductor body to a second conductivity type;
   forming an etch stop layer over the semiconductor body;
   after forming the etch stop layer, forming conductive lines over the etch stop layer, wherein forming conductive lines comprises forming a polysilicon layer, and forming a metal layer over the polysilicon layer;
   etching a recess in the semiconductor body between the conductive lines, the recess extending through the upper portion of the semiconductor body;
   forming a storage layer in the recess; and
   forming a conductor over the storage layer and within the recess.

2. The method of claim 1 wherein providing a semiconductor body comprises providing a semiconductor substrate.

3. The method of claim 1 wherein forming conductive lines comprises forming a conductive layer and etching the conductive layer into conductive lines.

4. The method of claim 3 and further comprising patterning and etching the etch stop layer prior to forming the conductive lines such that remaining portions of the etch stop layer remain over the semiconductor body and spaced from the conductive lines.

5. The method of claim 3 wherein forming the recess comprises etching the etch stop layer.

6. The method of claim 5 and further comprising forming spacers along sidewalls of the conductive lines prior to etching the etch stop layer and wherein etching the recess comprises etching the recess in alignment with the spacers.

7. The method of claim 3 wherein etching the conductive layer further comprises etching into the upper portion of the semiconductor body.

8. The method of claim 1 and further comprising forming spacers along sidewalls of the conductive lines prior to forming the recess.

9. The method of claim 8 wherein forming spacers comprises:
   forming an oxide liner over the sidewalls;
   forming a nitride layer over the oxide liner; and
   anisotropically etching the nitride layer.

10. The method of claim 8 wherein etching the recess comprises etching the recess in alignment with the spacers.

11. The method of claim 1 wherein forming conductive lines comprises forming conductive lines that are in electrical contact with the upper portion of the semiconductor body.

12. The method of claim 1 wherein forming a storage layer comprises forming an oxide-nitride-oxide layer sequence.

13. The method of claim 1 wherein forming a conductor over the storage layer comprises depositing polysilicon in the recess.

14. The method of claim 1 wherein doping the upper portion of the semiconductor body is performed prior to forming the conductive lines.

15. A method for fabricating a semiconductor device that includes a plurality of NROM memory cells, the semiconductor device comprising:
   a gate electrode, which is arranged at a top side of a semiconductor body or a semiconductor layer and is isolated from the semiconductor material by dielectric material; and
   a source region and a drain region, which are formed in the semiconductor material;
   the gate electrode being arranged in a trench formed in the semiconductor material between the source region and the drain region; and
   a storage layer being present at least between the source region and the gate electrode and between the drain region and the gate electrode, which storage layer is provided for trapping charge carriers;
   the method comprising:
   applying an etching stop layer over the whole area;
   applying at least one electrically conductive bit line layer on the etching stop layer; patterning the at least one electrically conductive bit line layer into portions that are arranged parallel to one another; after the patterning of the bit line layer and before the etching of a trench, removing the eching stop layer to an extent such that a region free of the material of the etching stop layer is present between the bit line layer and the semiconductor material present underneath; etching the trench into the semiconductor material from a top side of the semiconductor layer between said portions; and after patterning the at least one electrically conductive bit line layer and before the etching of the trench, introducing an implantation to define a position at which a boundary between a source/drain region and a channel region provided at a lower portion of the trench adjoins the trench; and filling said region with a contact layer made of an electrically conductive material.

16. The method as claimed in claim 15, wherein the at least one electrically conductive bit line layer comprises at least one material selected from the group consisting of doped polysilicon, tungsten, tungsten silicide, cobalt, cobalt silicide, titanium and titanium silicide.

17. The method as claimed in claim 15, wherein, before the etching of the trench, portions of the patterned bit line layer are covered with spacers on both sides and the trench is etched in the region between said spacers.

18. The meted as claimed in claim 15, wherein after the etching of the trench the method further comprises:
   applying an ONO storage layer; and
   introducing a material for the gate electrode into the trench.

19. A method for fabricating a semiconductor device tat includes a plurality of NROM memory cells, the semiconductor device comprising:
   a gate electrode, which is arranged at a top side of a semiconductor body or a semiconductor layer and is isolated from the semiconductor material by dielectric material; and
   a source region and a drain region, which are formed in the semiconductor material;
   the gate electrode being arranged in a trench formed in the semiconductor material between the source region and the drain region; and
   a storage layer being present at least between the source region and the gate electrode and between the drain region and the gate electrode, which storage layer is provided for trapping charge carriers;
   the method comprising:
   implanting source/drain regions in the semiconductor body;
   applying an etch stop layer over the semiconductor body;
   applying at least one electrically conductive bit line layer over the semiconductor body;
   patterning the at least one electrically conductive bit line layer into portions that are arranged parallel to one another, the patterning the at least one electrically conductive bit line layer using the etch stop layer after implanting the source/drain regions; and etching the trench into the semiconductor material from a top side of the semiconductor layer between said portions.

20. The method as claimed in claim 19, wherein the at least one electrically conductive bit line layer comprises at least one material selected from the group consisting of doped polysilicon, tungsten, tungsten silicide, cobalt, cobalt silicide, titanium and titanium silicide.

21. The method as claimed in claim 19:

wherein the etch stop layer is applied over the whole area, wherein the at least one electrically conductive bit line layer is applied on said etch stop layer;

after the patterning of the bit line layer and before the etching of the trench, removing the etch stop layer to an extent such that a region free of the material of the etch stop layer is present between the bit line layer and the semiconductor material present underneath; and filling said region with a contact layer made of an electrically conductive material.

22. The method as claimed in claim 19, wherein, before the etching of the trench, portions of the patterned bit line layer are covered with spacers on both sides and the trench is etched in the region between said spacers.

23. The method as claimed in claim 19, wherein after the etching of the trench the method further comprises:

applying an ONO storage layer; and introducing a material for the gate electrode into the trench.

* * * * *

UNITED STATES PATENT AND TRADEMARK OFFICE
CERTIFICATE OF CORRECTION

PATENT NO. : 7,205,195 B2
APPLICATION NO. : 11/006049
DATED : April 17, 2007
INVENTOR(S) : Kleint et al.

It is certified that error appears in the above-identified patent and that said Letters Patent is hereby corrected as shown below:

Column 8, line 39;  delete "meted" insert --method--
Column 8, line 44;  delete "tat"  insert --that--

Signed and Sealed this

Twenty-sixth Day of June, 2007

JON W. DUDAS
*Director of the United States Patent and Trademark Office*